US012597903B2

(12) United States Patent
Wu et al.

(10) Patent No.: US 12,597,903 B2
(45) Date of Patent: Apr. 7, 2026

(54) FILTER AND ASSOCIATED RECEIVING CIRCUIT

(71) Applicant: Realtek Semiconductor Corp., HsinChu (TW)

(72) Inventors: Yi-Ching Wu, HsinChu (TW); Chia-Jun Chang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 146 days.

(21) Appl. No.: 18/634,978

(22) Filed: Apr. 14, 2024

(65) Prior Publication Data

US 2024/0421791 A1 Dec. 19, 2024

(30) Foreign Application Priority Data

Jun. 16, 2023 (TW) .................................. 112122606

(51) Int. Cl.
H03H 7/06 (2006.01)
H03D 7/00 (2006.01)

(52) U.S. Cl.
CPC ................ H03H 7/06 (2013.01); H03D 7/00 (2013.01)

(58) Field of Classification Search
CPC ................................... H03D 7/00; H03H 7/06
See application file for complete search history.

(56) References Cited

U.S. PATENT DOCUMENTS

| | | | | |
|---|---|---|---|---|
| 10,153,934 | B1* | 12/2018 | Gathman | ............ H04L 27/2688 |
| 2004/0100342 | A1* | 5/2004 | Nishihara | ............ H03H 9/0095 |
| | | | | 333/133 |
| 2023/0402986 | A1* | 12/2023 | Yao | ...................... H03H 7/1741 |

FOREIGN PATENT DOCUMENTS

| | | | |
|---|---|---|---|
| CN | 109150131 A | | 1/2019 |
| CN | 215268062 U | * | 12/2021 |
| CN | 216599009 U | * | 5/2022 |
| CN | 217159270 U | * | 8/2022 |

* cited by examiner

*Primary Examiner* — Quan Tra
(74) *Attorney, Agent, or Firm* — Winston Hsu

(57) ABSTRACT

The present invention provides a filter configured to receive an input signal to generate a filtered signal. The filter includes a first component, a first capacitor and a second component. The first component is coupled between the input signal and a first terminal. The first capacitor is coupled between the first terminal and a second terminal. For the second component, a first node of the second component is coupled to the second terminal, and a second node of the second component is used to output the filtered signal. The first component and the second component are inductive components.

8 Claims, 3 Drawing Sheets

FILTER AND ASSOCIATED RECEIVING CIRCUIT

BACKGROUND OF THE INVENTION

1. Field of the Invention

The present invention relates to a filter.

2. Description of the Prior Art

In a conventional external digital pre-distortion (EDPD) circuit, in order to suppress the strength of a third-order harmonic in the received signal to achieve a better third-order counter intermodulation (CIM3), a filter will be set in the external pre-distortion circuit to filter out the third-order harmonic in the received signal. However, since a region between a ground voltage connected to the filter and a real ground voltage on the printed circuit board includes traces in the chip and bond wires of the package, additional inductance effects will be caused on the filter. Therefore, the characteristics of the filter will not be the same as expected, and the third-order harmonic in the received signal cannot be effectively filtered.

SUMMARY OF THE INVENTION

It is therefore an objective of the present invention to provide a filter that can effectively filter out the third-order harmonic in the received signal when the received ground voltage suffers the above-mentioned additional inductance effect, so as to solve the problems described in the prior art.

According to one embodiment of the present invention, a filter configured to receive an input signal to generate a filtered signal is disclosed. The filter comprises a first component, a first capacitor and a second component. The first component is coupled between the input signal and a first terminal. The first capacitor is coupled between the first terminal and a second terminal. For the second component, a first node of the second component is coupled to the second terminal, and a second node of the second component is used to output the filtered signal. The first component and the second component are inductive components.

According to one embodiment of the present invention, a receiving circuit positioned in a chip is disclosed, wherein the receiving circuit comprises a flirter and a mixer. The filter is configured to receive an input signal to generate a filtered signal, wherein the filter is coupled to a ground voltage, and the ground voltage is connected to an external ground voltage outside the chip through a pad of the chip. The mixer is configured to receive the filtered signal, and use an oscillation signal to perform a mixing operation on the filtered signal to generate a mixed signal. The filter comprises a first component, a first capacitor and a second component. The first component is coupled between the input signal and a first terminal. The first capacitor is coupled between the first terminal and a second terminal. For the second component, a first node of the second component is coupled to the second terminal, and a second node of the second component is used to output the filtered signal. The first component and the second component are inductive components.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
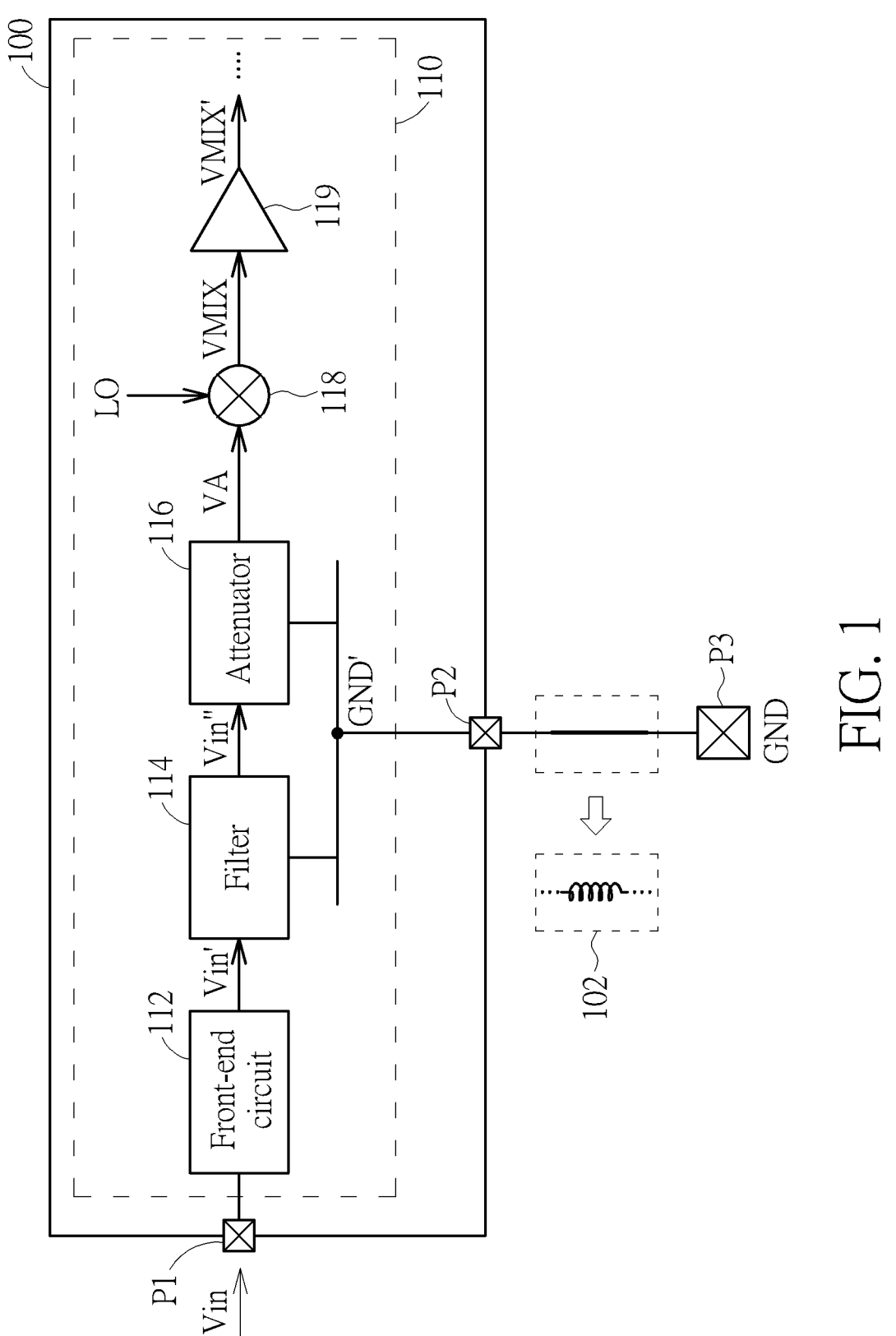
FIG. 1 is a diagram illustrating a chip according to one embodiment of the present invention.

FIG. 1 is a diagram illustrating a chip 100 according to one embodiment of the present invention, wherein the chip 100 comprises at least a receiving circuit 110 and two pads P1 and P2. As shown in FIG. 1, the receiving circuit 110 comprises a front-end circuit 112, a filter 114, an attenuator 116, a mixer 118 and a transimpedance amplifier (TIA) 119. In this embodiment, the receiving circuit 110 can be used for an external pre-distortion (EDPD) circuit, that is, the receiving circuit 110 receives a signal from a transmitting circuit via the pad P1 to generate signal distortion information, and provides the signal distortion information to the transmitting circuit for pre-distorting operation, but the present invention is not limited thereto.

In the receiving circuit 110, the front-end circuit 112 may comprise an electrostatic discharge (ESD) clamping circuit or other processing circuits, which are used to receive a signal Vin from the pad P1 to generate an input signal Vin'. The filter 114 is a low-pass filter, which is used to filter out high-frequency components in the input signal Vin' to generate a filtered signal Vin". In this embodiment, the input signal Vin' includes in-band signals and harmonic signals, such as third-order harmonics, and the filter 114 is used to filter out these harmonic signals. The attenuator 116 attenuates the filtered signal Vin" to reduce its strength, to generate an attenuated signal VA. The mixer 118 uses an oscillation signal LO to perform a mixing operation on the attenuated signal VA to reduce the frequency of the attenuated signal VA to generate a mixed signal VMIX. Then, the transimpedance amplifier 119 amplifies the mixed signal VMIX to generate an amplified signal VMIX', and transmits the amplified signal VMIX' to a back-end processing circuit for related processing.

In another embodiment of the present invention, the attenuator 116 can be removed from the receiving circuit 110, that is, the mixer 118 uses the oscillating signal LO to perform the mixing operation on the filtered signal Vin" to generate the mixed signal VMIX.

In this embodiment, the ground voltage GND' connected to the filter 114 is connected to the ground voltage GND on a pad P3 of the external printed circuit board through the pad point P2 of the chip 100, wherein the ground voltage GND is an external ground voltage of the chip 100. Since there may be a long trace between the ground voltage GND' connected to the filter 114 and the pad P2 of the chip 100, and the bonding wire of the package is between the pad P2 of the chip 100 and the pad P3 on the printed circuit board, so these traces and the bonding wire can be regarded as an equivalent inductance 102. The equivalent inductance 102 will cause the characteristics of the filter to be different from expected, especially when the frequency of the in-band signal included in the input signal Vin' is 5 GHz-6 GHz, and the frequency of the third-order harmonic is between 15 GHz-18 GHz. For example, if the filter 114 is implemented by a conventional notch filter or a resistor-capacitor low-pass filter, the third-order harmonic in the input signal Vin' cannot be effectively filtered due to the influence of the equivalent inductance 102.

Therefore, this embodiment provides the filter 114, which can offset or balance the equivalent inductance 102 caused by the above-mentioned traces and bonding wires, so that the filter 114 can effectively filter out the third-order harmonic in the input signal Vin'. Specifically, referring to the diagram of the filter 114 shown in FIG. 2, the filter 114 comprises inductors L1-L3, capacitors C1 and C2, and resistors R1 and R2, wherein the inductor L1 is coupled between a terminal N1 and the input signal Vin', the capacitor C1 is coupled between the terminal N1 and a terminal N2, the inductor L2 is coupled between the terminal N2 and a terminal N4, the inductor L3 is coupled between the terminal N1 and a terminal N3, the capacitor C2 is coupled between the terminal N3 and the terminal N4, the resistor R1 is coupled between the terminal N2 and the ground voltage GND', the resistor R2 is coupled between the terminal N3 and the ground voltage GND', and the terminal N4 is used to output the filtered signal Vin''. In the filter 114 shown in FIG. 2, by using the design of the inductors L1, L2, L3 and capacitors C1, C2, the equivalent inductance 102 between the ground voltage GND' and the ground voltage GND on the pad P3 of the external printed circuit board can be offset or balanced to stabilize the performance of the filter 114. In addition, the resistors R1 and R2 are used for impedance matching between an input terminal and an output terminal of the filter 114.

It is noted that, the above-mentioned embodiment implements the filter 114 with inductors L1, L2 and L3. In another embodiment of the present invention, any one of the inductors L1, L2 and L3 of the filter 114 can be replaced by other components with similar functions, such as inductive components, wherein the inductive elements include but are not limited to transmission lines. For example, the inductor L1 is replaced by a transmission line, and the inductors L2 and L3 are still used. For example, the inductors L1 and L2 are replaced by transmission lines, and the inductor L3 is still used. For example, the inductors L1, L2 and L3 are all replaced by transmission lines. It should be noted that when the above replacement is implemented, the capacitance of the capacitors C1 and C2 may need to be adjusted accordingly, and these alternative designs should fall within the scope of the present invention.

Figure 2:
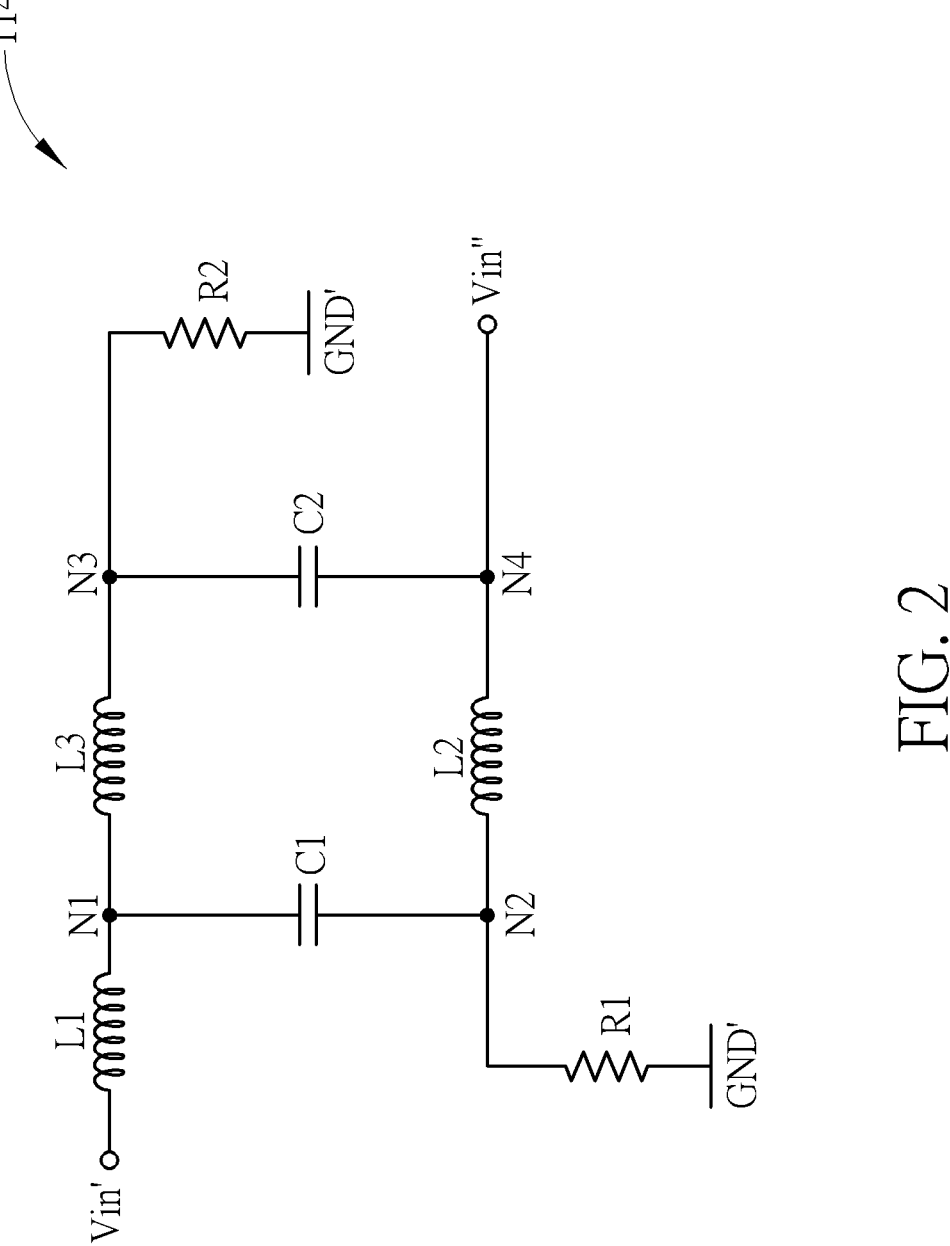
FIG. 2 is a filter according to one embodiment of the present invention.

Table 1 shows the loss of the filter 114 in FIG. 2, the conventional resistor-capacitor low-pass filter and the band-stop filter at different frequencies, wherein frequencies 5 GHz, 5.56 GHz and 6 GHz are in-band signals in the input signal Vin', and 15 GHz, 16.68 GHz and 18 GHz are the corresponding third-order harmonics. As shown in Table 1, using the filter 114 in FIG. 2 can make the in-band signal and the third-order harmonic have the largest loss difference, so it has the best filtering effect.

TABLE 1

| frequency | loss of filter 114 (dB) | loss of resistor-capacitor low-pass filter (dB) | loss of band-stop filter (dB) |
|---|---|---|---|
| 5 GHz | −3.54 dB | −24.68 dB | −28 dB |
| 5.56 GHz | −2.53 dB | −23.29 dB | −27.7 dB |
| 6 GHz | −2.42 dB | −24.8 dB | −27.5 dB |
| 15 GHz (3*5 GHz) | −20.07 dB | −30.23 dB | −22.5 dB |
| 16.68 GHz) (3*5.56 GHz) | −19.95 dB | −36.8 dB | −23.45 dB |

TABLE 1-continued

| frequency | loss of filter 114 (dB) | loss of resistor-capacitor low-pass filter (dB) | loss of band-stop filter (dB) |
|---|---|---|---|
| 18 GHz) (3*6 GHz) | −20.48 dB | −30.69 dB | −23.6 dB |

Figure 3:
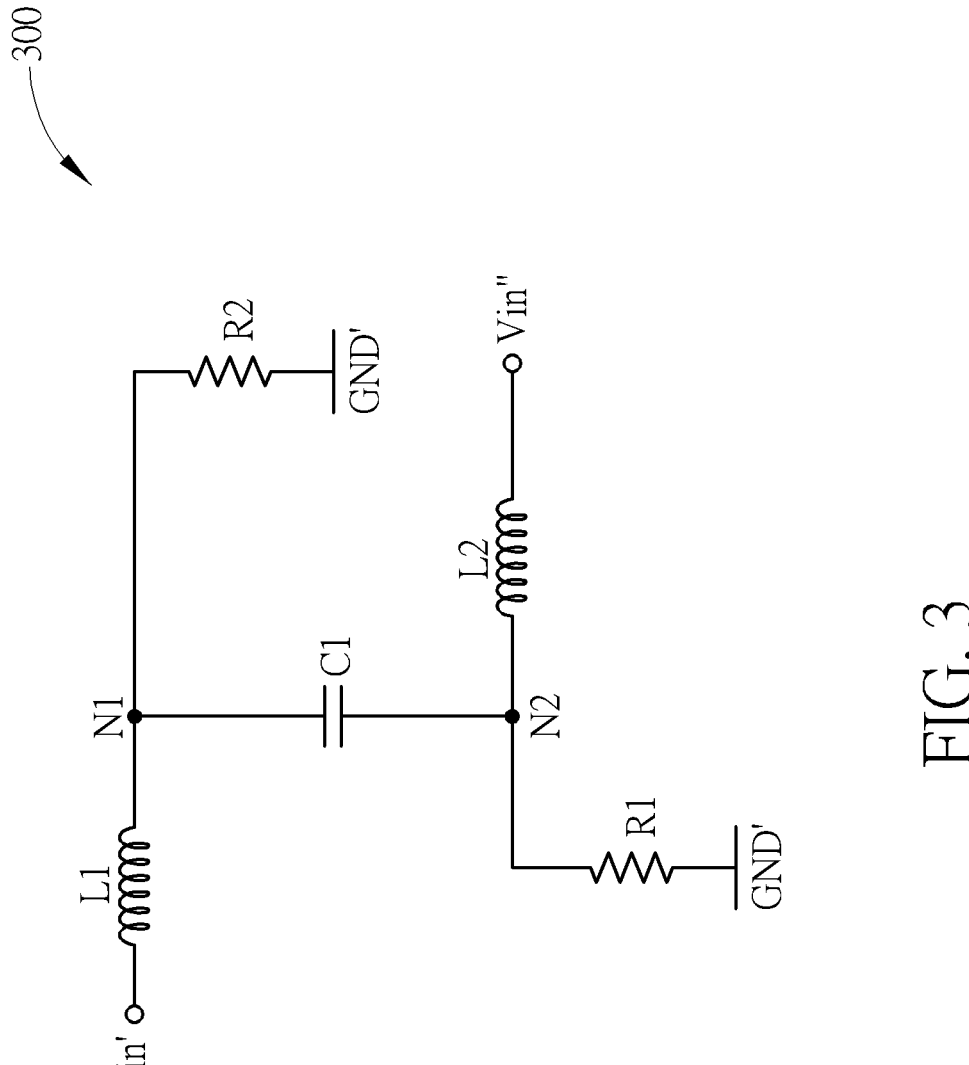
FIG. 3 is a filter according to one embodiment of the present invention.

FIG. 3 is a diagram illustrating a filter 300 according to one embodiment of the present invention, wherein the filter 300 can be used to implement the filter 114 shown in FIG. 1. As shown in FIG. 3, the filter 300 comprises inductors L1 and L2, a capacitor C1, and resistors R1 and R2, wherein the inductor L1 is coupled between a terminal N1 and the input signal Vin', the capacitor C1 is coupled between the terminal N1 and a terminal N2, the resistor R1 is coupled between the terminal N2 and the ground voltage GND', the resistor R2 is coupled between the terminal N1 and the ground voltage GND', a first node of the inductor L2 is connected to the terminal N2, and a second node of the inductor L2 is used to output the filtered signal Vin''. In the filter 300 shown in FIG. 3, by using the design of the inductors L1, L2 and the capacitor C1, the equivalent inductance 102 between the ground voltage GND' and the ground voltage GND on the pad P3 of the external printed circuit board can be offset or balanced to stabilize the performance of the filter 300. In addition, the resistors R1 and R2 are used for impedance matching between an input terminal and an output terminal of the filter 300.

It is noted that, the above-mentioned embodiment implements the filter 300 with inductors L1 and L2. In another embodiment of the present invention, any one of the inductors L1 and L2 of the filter 300 can be replaced by other components with similar functions, such as inductive components, wherein the inductive elements include but are not limited to transmission lines. For example, the inductor L1 is replaced by a transmission line, and the inductor L2 is still used. For example, both the inductors L1 and L2 are replaced by transmission lines. It should be noted that when the above replacement is implemented, the capacitance of the capacitors C1 and C2 may need to be adjusted accordingly, and these alternative designs should fall within the scope of the present invention.

Briefly summarized, in the filter of the present invention, by using a special inductance configuration to complete the design of the filter, the performance is not affected due to the imperfection of the ground voltage. Therefore, the filter of the present invention can effectively filter out the third-order harmonics to improve the third-order counter intermodulation (CIM3).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filter configured to receive an input signal to generate a filtered signal, comprising:
   a first component, coupled between the input signal and a first terminal;
   a first capacitor, coupled between the first terminal and a second terminal;

a second component, wherein a first node of the second component is coupled to the second terminal, and a second node of the second component is used to output the filtered signal;

a third component, coupled between the first terminal and a third terminal, wherein the third component is an inductive component; and a second capacitor, coupled between the third terminal and a fourth terminal, wherein the fourth terminal is coupled to the second node of the second component, and the fourth terminal is used to output the filtered signal;

a first resistor, coupled between the second terminal and a ground voltage; and a second resistor, coupled between the third terminal and the ground voltage;

wherein the first component and the second component are inductive components.

2. The filter of claim 1, wherein the first component, the second component and the third component comprise at least one inductor.

3. The filter of claim 1, wherein the first component, the second component and the third component comprise at least one transmission line.

4. A receiving circuit positioned in a chip, comprising:

a filter, configured to receive an input signal to generate a filtered signal, wherein the filter is coupled to a ground voltage, and the ground voltage is connected to an external ground voltage outside the chip through a pad of the chip, and the filter comprises:

a first component, coupled between the input signal and a first terminal;

a first capacitor, coupled between the first terminal and a second terminal;

a second component, wherein a first node of the second component is coupled to the second terminal, and a second node of the second component is used to output the filtered signal, wherein the first component and the second component are inductive components;

a third component, coupled between the first terminal and a third terminal, wherein the third component is an inductive component; and a second capacitor, coupled between the third terminal and a fourth terminal, wherein the fourth terminal is coupled to the second node of the second component, and the fourth terminal is used to output the filtered signal;

a first resistor, coupled between the second terminal and the ground voltage; and a second resistor, coupled between the third terminal and the ground voltage; and a mixer, configured to receive the filtered signal, and use an oscillation signal to perform a mixing operation on the filtered signal to generate a mixed signal.

5. The receiving circuit of claim 4, wherein the first component, the second component and the third component comprise at least one inductor.

6. The receiving circuit of claim 4, wherein the first component, the second component and the third component comprise at least one transmission line.

7. The filter of claim 1, wherein the first resistor and the second resistor are used for impedance matching between an input terminal and an output terminal of the filter.

8. The receiving circuit of claim 4, wherein the first resistor and the second resistor are used for impedance matching between an input terminal and an output terminal of the filter.

* * * * *